United States Patent
Delacruz et al.

(10) Patent No.: US 10,684,929 B2
(45) Date of Patent: Jun. 16, 2020

(54) SELF HEALING COMPUTE ARRAY

(71) Applicant: Xcelsis Corporation, San Jose, CA (US)

(72) Inventors: Javier A. Delacruz, San Jose, CA (US); Steven L. Teig, Menlo Park, CA (US); David Edward Fisch, Pleasanton, CA (US); William C. Plants, Campbell, CA (US)

(73) Assignee: Xcelsis Corporation, San Jose, CA (US)

( * ) Notice: Subject to any disclaimer, the term of this patent is extended or adjusted under 35 U.S.C. 154(b) by 201 days.

(21) Appl. No.: 15/849,468

(22) Filed: Dec. 20, 2017

(65) Prior Publication Data

US 2018/0173600 A1 Jun. 21, 2018

Related U.S. Application Data

(60) Provisional application No. 62/437,554, filed on Dec. 21, 2016.

(51) Int. Cl.
*G06F 11/00* (2006.01)
*G06F 11/26* (2006.01)
(Continued)

(52) U.S. Cl.
CPC .......... *G06F 11/26* (2013.01); *G06F 11/2236* (2013.01); *G06F 11/273* (2013.01); *H01L 24/32* (2013.01); *H01L 24/83* (2013.01); *H01L 24/94* (2013.01); *G06N 3/063* (2013.01); *G06N 20/00* (2019.01); *H01L 25/18* (2013.01); *H01L 25/50* (2013.01); *H01L 2224/32145* (2013.01); *H01L 2224/32146* (2013.01); *H01L 2224/8312* (2013.01); *H01L 2224/83895* (2013.01); *H01L 2224/83896* (2013.01); *H01L 2924/143* (2013.01); *H01L 2924/1432* (2013.01); *H01L 2924/1434* (2013.01); *H01L 2924/14335* (2013.01)

(58) Field of Classification Search
CPC .. G06F 2217/64; G06F 11/2236; G06F 11/26; G06F 11/273
See application file for complete search history.

(56) References Cited

U.S. PATENT DOCUMENTS

| | | | |
|---|---|---|---|
| 6,208,947 B1 * | 3/2001 | Beffa | G01R 31/2894 438/14 |
| 6,423,558 B1 * | 7/2002 | Maeda | H01L 22/20 257/E21.525 |

(Continued)

*Primary Examiner* — Charles Ehne
(74) *Attorney, Agent, or Firm* — Lerner, David, Littenberg, Krumholz & Mentlik, LLP

(57) ABSTRACT

This disclosure pertains to hardware compute arrays (sometimes called systolic arrays) for applications such as artificial intelligence (AI), machine learning (ML), digital signal processing (DSP), graphics processing units (GPUs), and other computationally intensive applications. More particularly, it pertains to novel and advantageous architecture innovations for efficiently and inexpensively implementing such arrays using multiple integrated circuits. Hardware and methods are disclosed to allow compute arrays to be tested after face-to-face or wafer-to-wafer bonding and without out any pre-bonding test. Defects discovered in the post-bonding testing can be completely or partially healed increasing yields and reducing costs.

18 Claims, 19 Drawing Sheets

(51) Int. Cl.
  H01L 23/00 (2006.01)
  G06F 11/22 (2006.01)
  G06F 11/273 (2006.01)
  H01L 25/00 (2006.01)
  H01L 25/18 (2006.01)
  G06N 20/00 (2019.01)
  G06N 3/063 (2006.01)

(56) References Cited

U.S. PATENT DOCUMENTS

| | | |
|---|---|---|
| 8,140,297 B2 | 3/2012 | Bartley et al. |
| 2003/0140286 A1* | 7/2003 | Shinbo ............ G01R 31/31922 714/699 |
| 2005/0273749 A1* | 12/2005 | Kirk ................ H03K 17/693 716/55 |

* cited by examiner

SELF HEALING COMPUTE ARRAY

RELATED APPLICATIONS

This patent application claims priority to and the benefit of U.S. Provisional Patent Application Ser. No. 62/437,554, entitled "SELF HEALING COMPUTE ARRAY ARCHITECTURE", filed Dec. 21, 2016, which is herein incorporated by reference in its entirety.

FIELD OF THE INVENTION

This disclosure pertains to hardware compute arrays (sometimes called systolic arrays) for applications such as artificial intelligence (AI), machine learning (ML), digital signal processing (DSP), graphics processing units (GPUs), and other computationally intensive applications. More particularly, it pertains to novel and advantageous architecture innovations for efficiently and inexpensively implementing such arrays.

BACKGROUND OF THE INVENTION

In recent years, heterogeneous computing has become prominent in an increasing number of application areas. Of note is the use of graphics processing units (GPUs) and other specialized coprocessors in mainstream computational equipment in areas such as video displays and gaming, digital signal processing (DSP), image processing, machine learning, big data, high performance computing, network packet processing, data encryption, and others. These coprocessors are often used to support a homogeneous cluster of central processing units (CPUs) or micro processing units (MPUs) which function as a system's main processor.

Many of the heterogeneous co-processors are implemented using compute arrays which are parallel computing architectures comprising rows and columns of homogeneous data processing units (DPUs). The benefit is that repeated calculations on partial results can be passed on from DPU to DPU and performed completely within the array without any need to access external resources such as caches, main memory, busses, etc. This avoids many of the bottlenecks present in more conventional complex instruction set computing (CISC) or reduced instruction set computing (RISC) compute architectures.

FIG. 1 illustrates an exemplary and simplified DPU 100 of a type known in the art. DPU 100 comprises a number of value inputs 102, an input multiplexer 104, a value memory 106, a coefficient memory 108, a multiply and accumulate circuit 110, and a value output 112.

DPU 100 is part of an array (not shown) of many DPUs 100 arranged in rows and columns. The value inputs 102 are coupled to a plurality of value outputs 112 in a plurality of the other DPUs 100 in the array. Similarly, value output 112 is coupled to one or more value inputs 102 in other DPUs 100 in the array.

Multiplexer 104 selects between the various value inputs 102 and directs them to value memory 106 where their values are stored until needed by multiply and accumulate circuit 110.

Coefficient memory 108 stores a plurality of coefficients to be processed along with the values stored in value memory 106. In exemplary DPU 100, the multiply and accumulate circuit 110 accesses a value from value memory 106 and a coefficient from coefficient memory 108, multiplies them together, and adds the result to the sum of previous multiplications of value-coefficient pairs. Value memory 106 and coefficient memory 108 may, for example, be either random access memories (RAM) or first in/first out (FIFO) memories. In embodiments employing FIFOs, the loopback connection around coefficient memory 108 may be used for cycling the same coefficients repeatedly through the coefficient memory 108 while new sets of values are continuously passed through the value memory 106 once per data set. The results from multiply and accumulate circuit 110 is then presented to other DPUs 100 in the array through value output 112.

The purpose of the array is to perform a large number of multiply and accumulate operations in both series and in parallel. Each DPU 100 is a relatively small circuit. The number of bits of the values and coefficients as well as the depths of value memory 106 and coefficient memory 108 are determined by the application and are a matter of design choice. Persons skilled in the art will appreciate that DPU 100 is a very generic compute unit and that many possible compute units performing similar or other operations, both known in the art and yet to be invented, may be combined in similar compute arrays.

The ubiquity of data processing devices from cell phones, tablets, sensors, security and other cameras, the Internet of things (IOT), and other battery operated devices, makes it highly desirable to have compute arrays that are small, inexpensive, and low in power consumption. In particular, it is desirable to pair up compute array DPUs with appropriately sized, low powered, inexpensive memories. Unfortunately, monolithic solutions like embedded static random access memory (eSRAM) or embedded dynamic random access memory (eDRAM) come with substantial area overhead costs. Using external memory chips is even more expensive and the external interfaces use unacceptable power levels for independent, mobile, and other battery powered devices.

DETAILED DESCRIPTION OF THE INVENTION

Those of ordinary skill in the art will realize that the following figures and descriptions of exemplary embodiments and methods are illustrative only and not in any way limiting. Other embodiments will readily suggest themselves to such skilled persons after reviewing this disclosure.

Certain embodiments of the present disclosure utilize face-to-face (F2F) or wafer-to-wafer (W2 W) bonding of memory arrays sized appropriately for the DPUs in a compute array. This may reduce the size of the DPUs because the memory may be removed or relocated to another integrated circuit or wafer, and it addresses the power since the F2F/W2 W bonding allows a much smaller and lower power I/O architecture. In some embodiments, an array self-healing property may also exploited allowing routing around or through defective DPUs and/or memory arrays. This improves the array integrity and allows otherwise imperfect units to be used and sold.

Figure 2A:
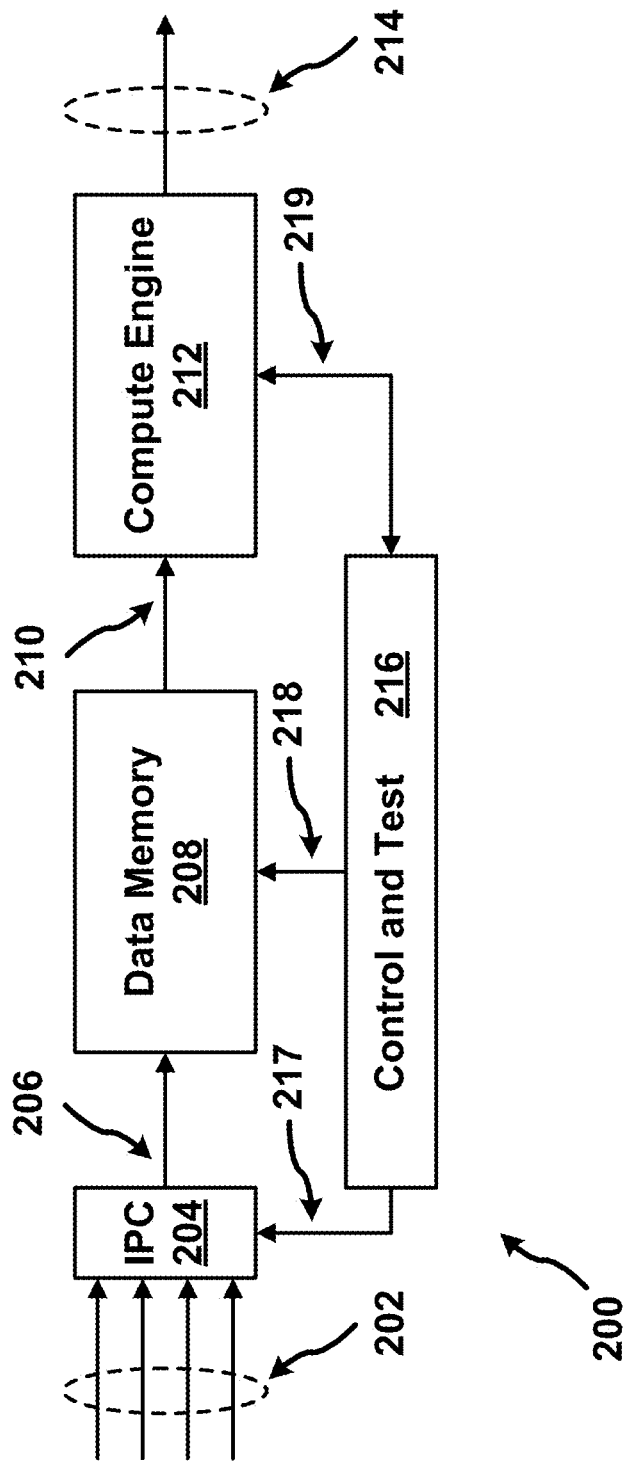
FIG. 2A illustrates an exemplary DPU according to an embodiment of the present invention.

FIG. 2A illustrates an exemplary DPU 200 according to an embodiment of the present invention. DPU 200 comprises a plurality of data input conductors 202 coupled to an input processing circuit (IPC) 204, a data memory (DM) 208 coupled to the input processing circuit 204 through data conductors 206, a compute engine (CE) 212 coupled to the DM 208 through data conductors 210, data output conductors 214 coupled to CE 212, and a control and test circuit (CTC) 216 coupled to IPC 204, DM 208 and CE 212 through control conductors 217, 218 and 219 respectively. In the sense used here, "conductors" means a "bus of one or more electrically conductive signal lines."

Figure 1:
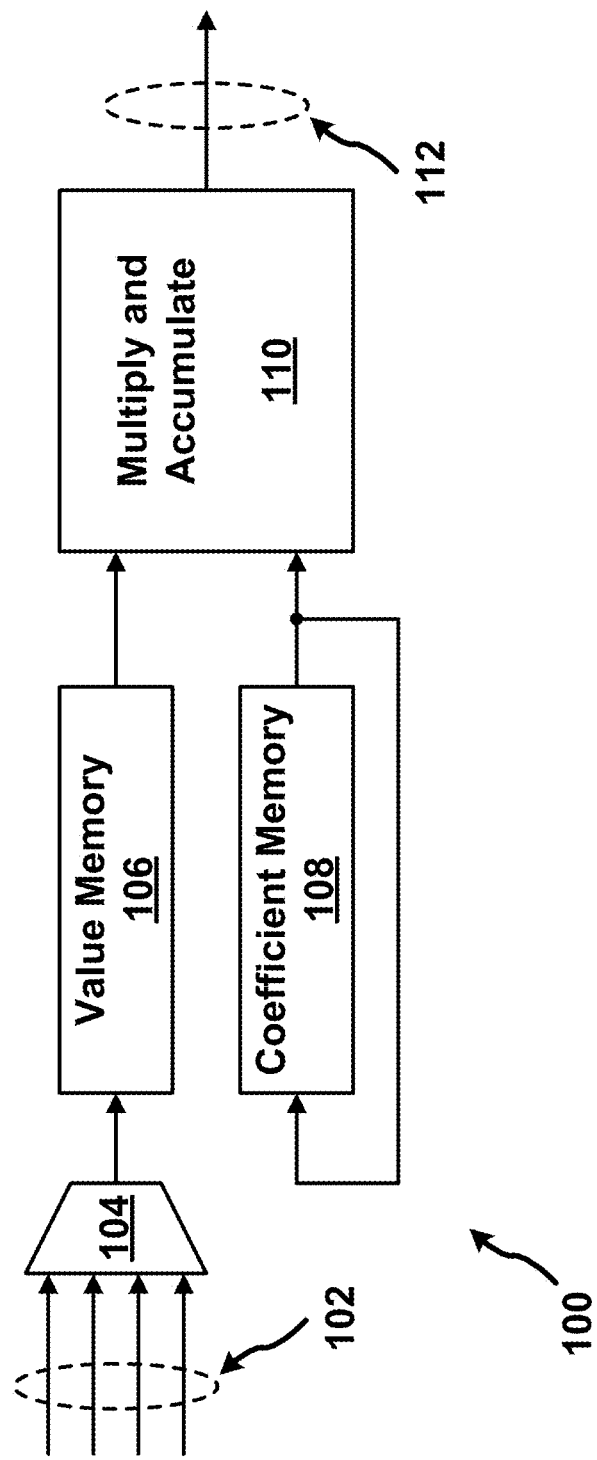
FIG. 1 illustrates an exemplary and simplified DPU of a type known in the art.

The operation of DPU 200 is similar to, though more generalized than, that of DPU 100 from FIG. 1. For example, in some embodiments input processing circuit 204 may perform a multiplexing function similar to that of multiplexer 104, but may contain other circuitry used for processing input data as well as providing some of the test functionality for DPU 200.

Similarly, data memory 208 may be used for value and coefficient data in some embodiments, but may also be used to store other sorts of data depending on the functionality of compute engine 212.

Compute engine 212 may perform multiply and accumulate functionality, but may also comprise hardware or software enabling other types of computations. CE 212 may also be reconfigured at power up, system reset, or on-the-fly to perform different computations at different times as a matter of design choice.

Control and test circuit 216 may orchestrate the interactions between IPC 204, DM 208, and CE 212. CTC 216 may operate the DPU 200 in its normal computational mode during normal array processing times, may control test functions at appropriate times, configure or reconfigure DPU 200 as needed, and may orchestrate the flow of data into and out of DPU 200.

It will be appreciated by those skilled in the art that the output conductors 214 of DPU 200 may couple to the input data conductors 202 of multiple DPUs 200 to allow different compute array configurations as well as compute array redundancy and repairs. Similarly, it will be appreciated by such skilled persons that a sufficient number of input data conductors 202 will be coupled to other DPUs 200 to allow different compute array configurations as well as compute array redundancy and repairs.

Figure 2B:
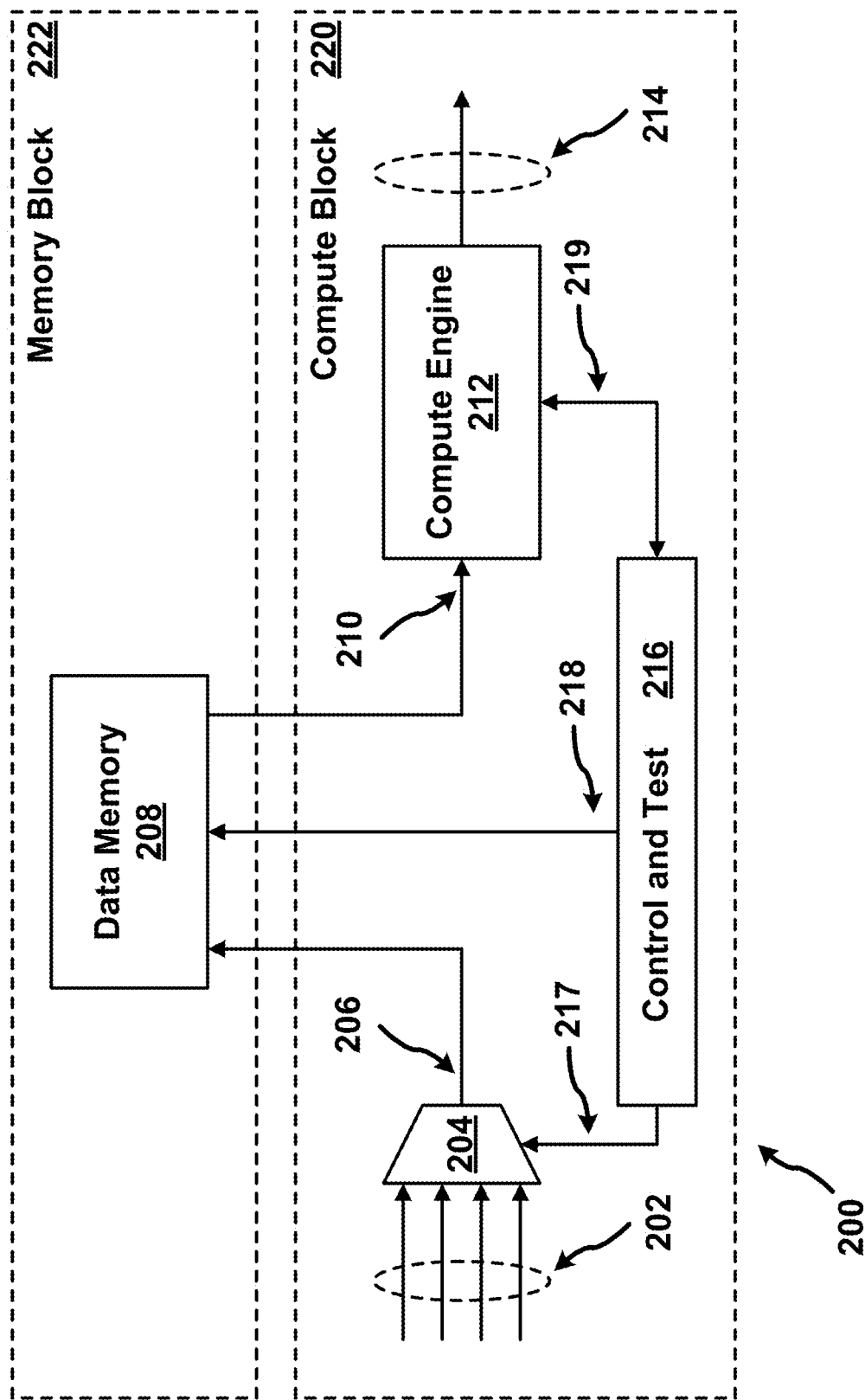
FIG. 2B illustrates the exemplary DPU of FIG. 2A partitioned into a compute block and a memory block according to an embodiment the present invention.

FIG. 2B illustrates the exemplary DPU 200 of FIG. 2A, showing it partitioned into a compute block 220 and a memory block 222 according to an embodiment of the present invention. The functionality of DPU 200 may be substantially the same as in FIG. 2A. The partitioning may allow part of the circuitry of DPU 200 to be fabricated on two different semiconductor wafers and then assembled together as a single circuit. Not only can this save die area and packaging costs, it also allows compute block 220 and memory block 222 to be fabricated using different technology nodes and/or different processes better suited to the compute and memory functions.

Figure 2C:
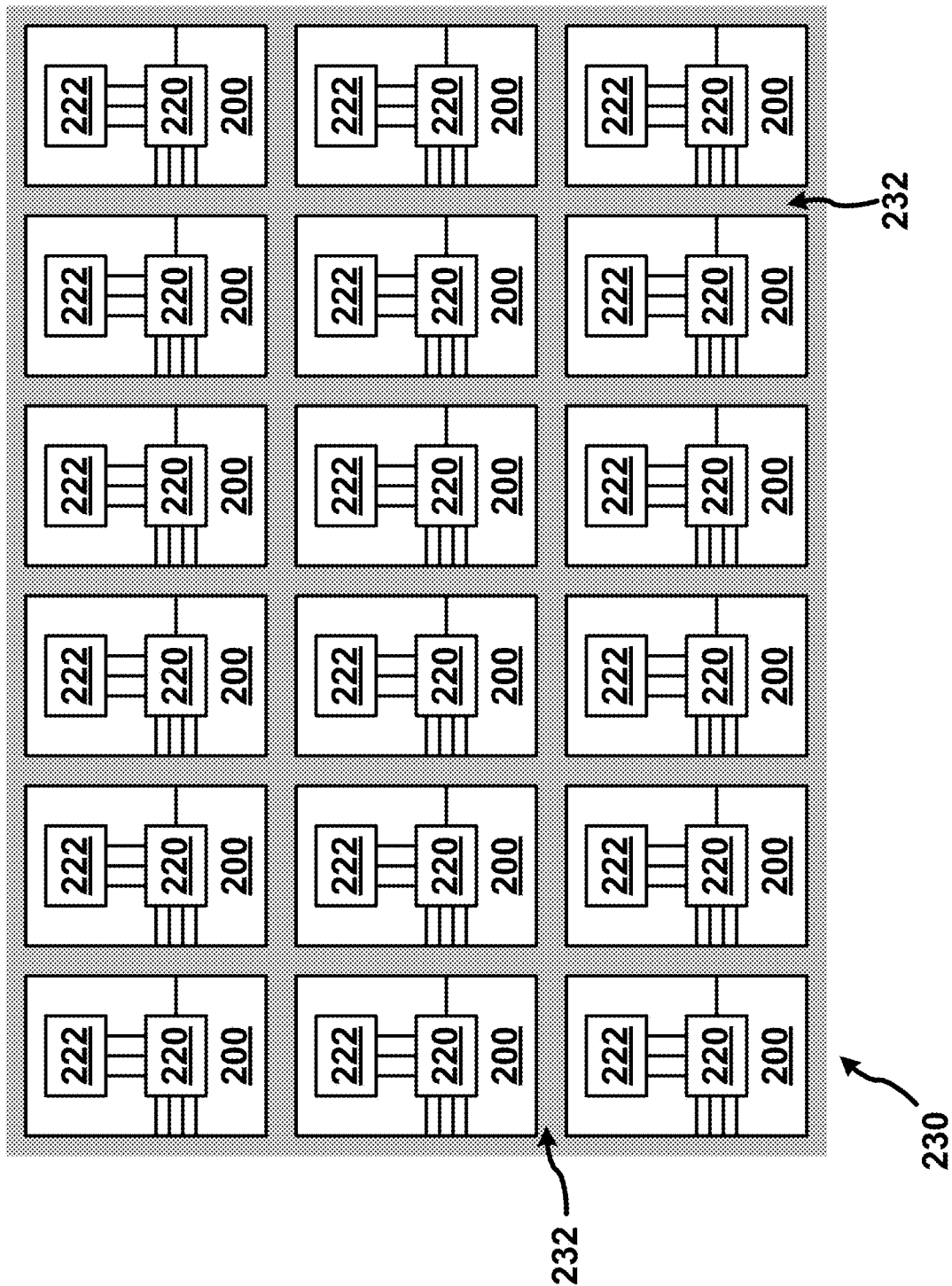
FIG. 2C illustrates an array of the exemplary DPUs of FIG. 2A according to an embodiment the present invention.

FIG. 2C illustrates an array 230 of the exemplary DPUs 200 of FIG. 2A according to an embodiment of the present invention. The array 230 comprises rows and columns of DPUs 200. Further shown are the compute blocks 220 and memory blocks 222. In this embodiment, each instance of DPU 200 and its compute block 220 and memory block 222 is implemented in the same integrated circuit.

The routing 232 between the DPUs 200 is shown abstractly as a shaded area. While routing 232 is shown between the DPUs 200 in the diagram, persons skilled in the art will appreciate that interconnections may run through the DPUs 200 and not just around them. Routing 232 is used for the interconnection of the data input conductors 202 and the data output conductors 212, as well as for the distribution of global control signal conductors, clock signal conductors, power and ground supply conductors, etc. Persons of ordinary skill in the art will appreciate that there are many ways these different conductors may be organized and interconnected as a function of the intended applications for the array 230 and are a matter of design choice for each embodiment of the invention.

Figure 2D:
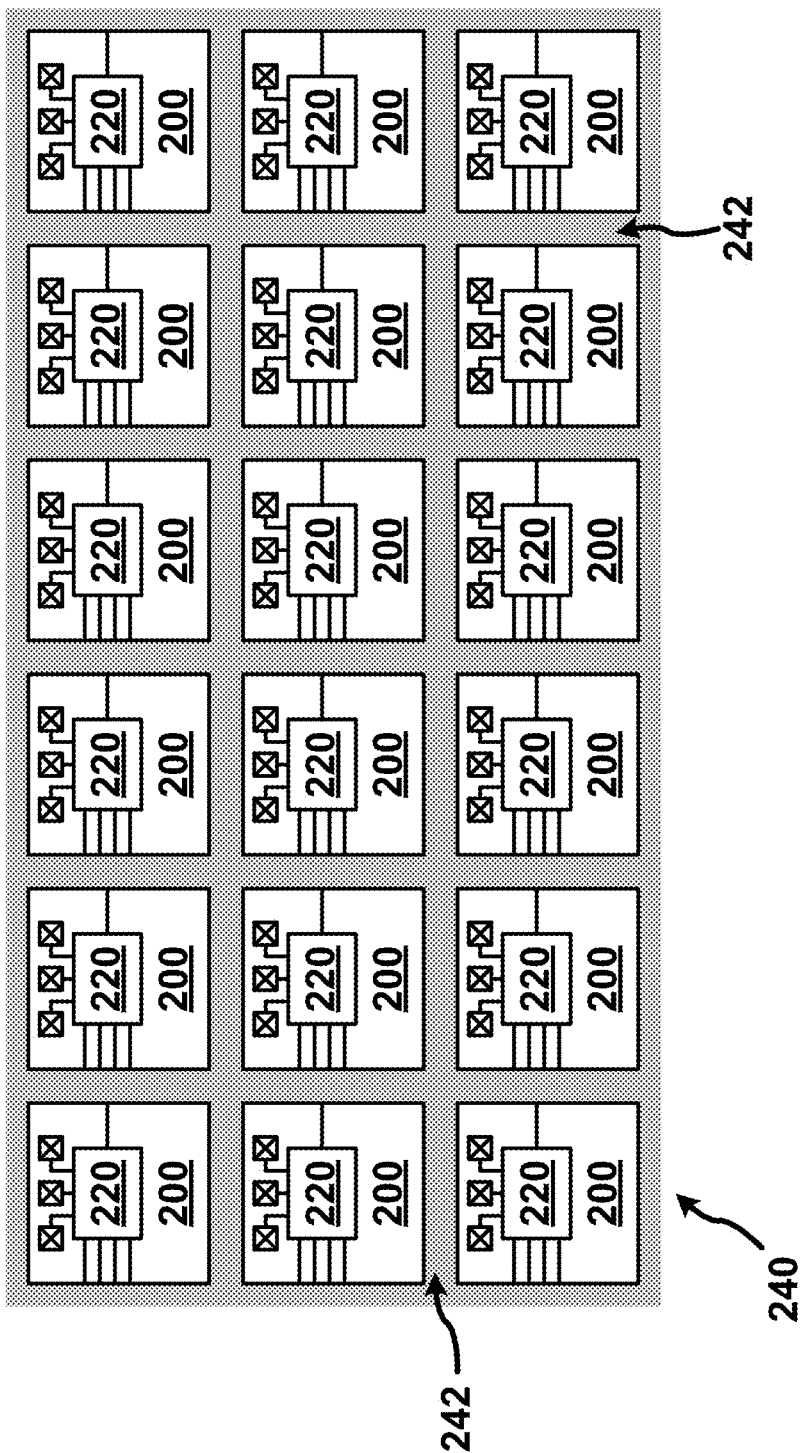
FIG. 2D illustrates an array of the exemplary DPUs of FIG. 2B with the memory block removed according to an embodiment the present invention.

FIG. 2D illustrates an array 240 of the exemplary DPUs 200 of FIG. 2A with the memory block 230 removed according to an embodiment the present invention. FIG. 2D illustrates the rows and columns of DPUs 200 in the array 240. Also shown are the compute blocks 220 and an abstraction of the routing 242. These may be similar to the compute blocks 220 and routing 232 in FIG. 2C. In each DPU 200 there are shown abstractions of three small interconnect pads (unlabeled squares with an internal "X" shape). These are placeholders for the inter-block portions of the conductors 206, 210 and 218 shown in FIG. 2B and represent the connection points to the memory blocks 222 that will eventually be assembled on top of the compute blocks 220.

Figure 2E:
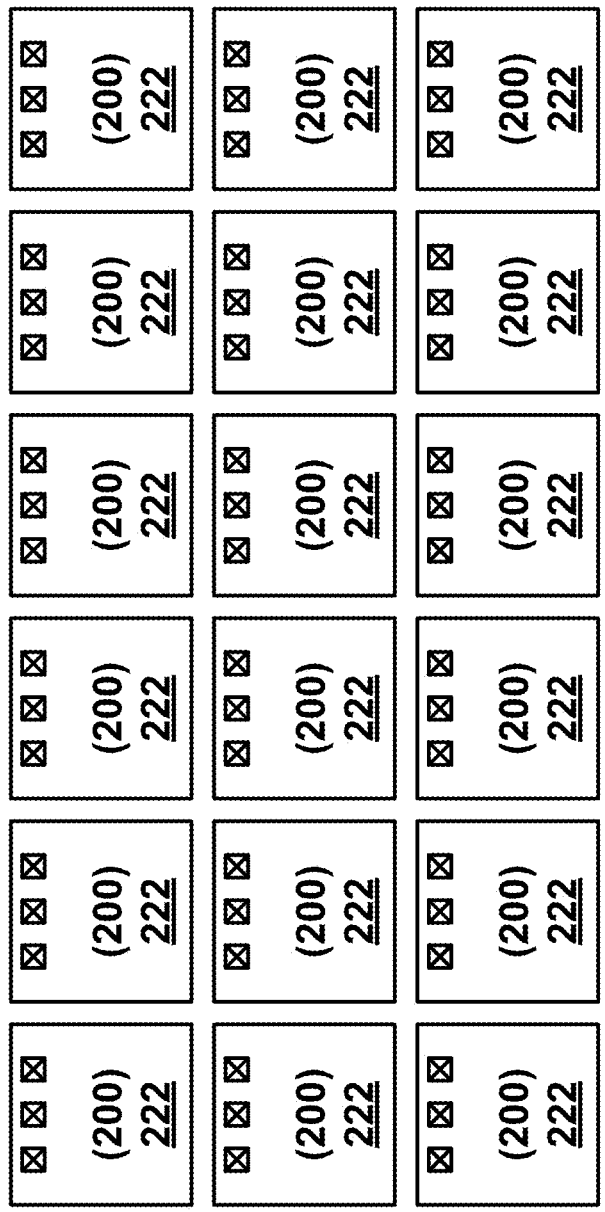
FIG. 2E illustrates an array of the exemplary DPUs of FIG. 2B with the memory blocks located over the remainder of the DPUs according to an embodiment the present invention.

FIG. 2E illustrates an exemplary array 250 of the memory blocks 222 located over the locations of the DPUs 200 in array 240 of FIG. 2D (not shown) according to an embodiment the present invention. In each memory block 222 there are shown abstractions of three small interconnect pads (unlabeled squares with an internal "X" shape). These are placeholders for the conductors 206, 210 and 218 shown in FIG. 2B and represent connection points to the compute blocks 220 that will eventually be assembled underneath the memory blocks 222. In some embodiments there may be no interconnection directly between the memory blocks 222. This can be advantageous because it allows every space between memory blocks 222 to be used as a scribe line. This allows an entire wafer of memory blocks 222 to sawn into arrays of different sizes depending on the size of the array 240 of FIG. 2D in any given application. Thus one mask set can provide all of the memory blocks 222 for an entire family of parts comprising devices where array 240 is differently sized and compute block 220 is differently designed or configured for different applications, saving considerable mask making costs. Another advantage is that the memory blocks 222 being isolated and independent allows certain types of failures like, for example, power and ground supply short circuits can be isolated to a single memory block 222 by the associated compute block 220 and not damage other memory blocks 222.

Figure 2F:
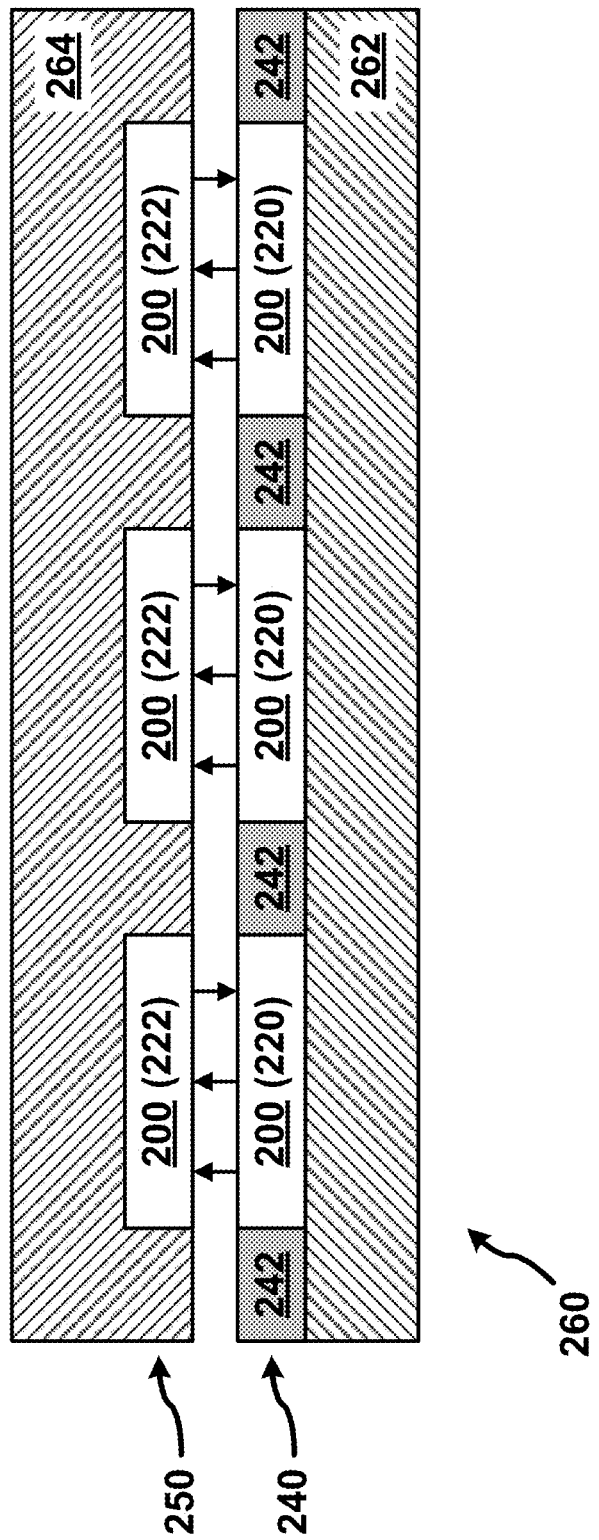
FIG. 2F illustrates a side view of the structures of FIGS. 2D and 2E according to an embodiment the present invention.

FIG. 2F illustrates a side view 260 of the combined structures of arrays 240 and 250 of FIGS. 2D and 2E respectively according to an embodiment the present invention. The compute block 220 portions of DPUs 200 and the routing 242 are shown as fabricated in the substrate of integrated circuit 262, while the memory block 222 portions of DPUs 200 are shown as fabricated in the substrate of integrated circuit 264. The small unlabeled vertical arrows are placeholders for the inter-block portions of the conductors 206, 210 and 218 shown in FIG. 2B and represent the connection points between the compute blocks 220 and the memory blocks 222 when the structure is fully assembled. In this embodiment, the assembly may be implemented using a face-to-face (F2F) or wafer-to-wafer (W2W) connection as a matter of design choice.

An example of a suitable F2F technology would be Direct Bond Interconnect (DBI®) from Invensas Bonding Technologies, Inc. which attaches integrated circuits to wafers by means of a room temperature dielectric bonding technology followed by low temperature annealing. An example of a suitable W2W technology would be ZiBond®, also from Invensas Bonding Technologies, Inc., that is a low temperature homogenous (e.g. oxide-to-oxide) direct bonding technology that forms strong bonds between wafers or die with same or different coefficients of thermal expansion (CTE). Persons skilled in the art will realize other F2F and W2W bonding techniques may be used and fall within the scope of the invention.

Figure 2G:
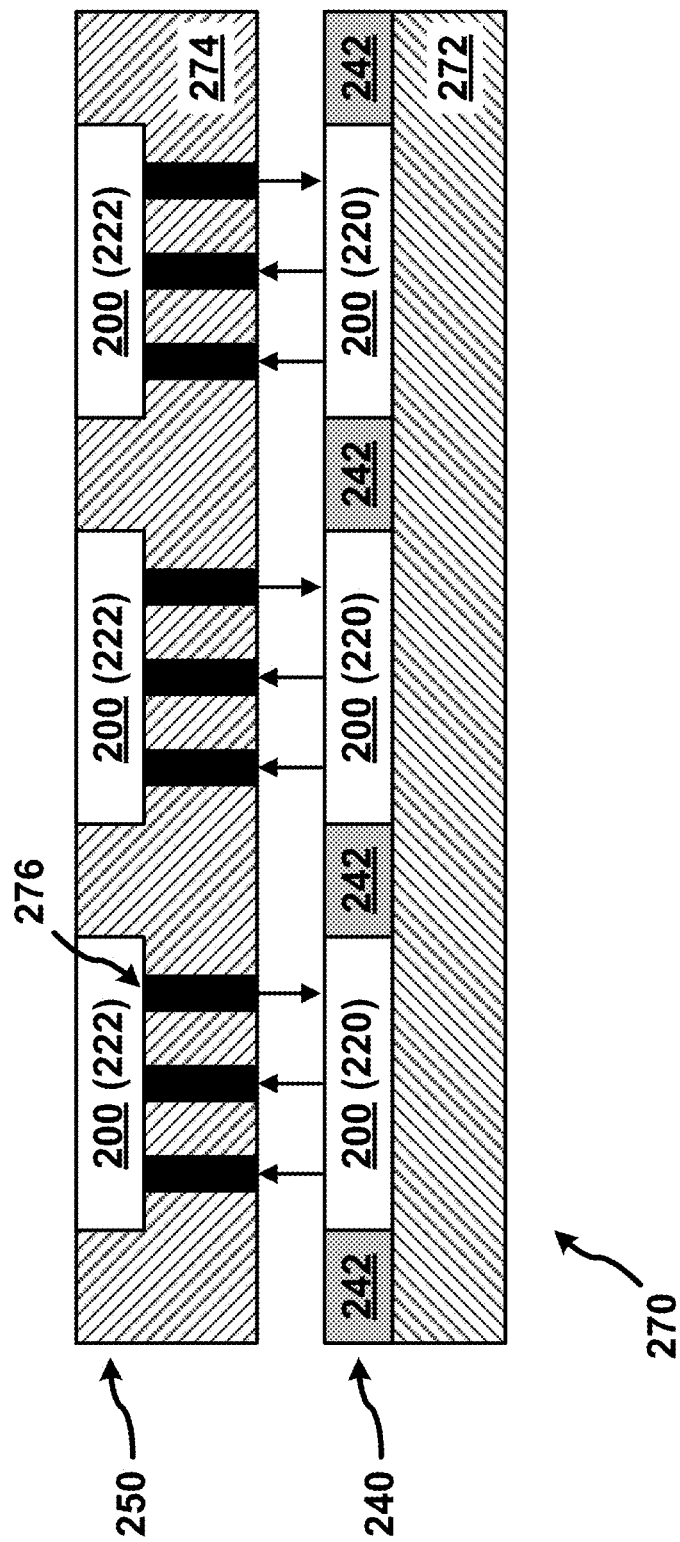
FIG. 2G illustrates a side view of the structures of FIGS. 2D and 2E according to an embodiment the present invention.

FIG. 2G illustrates a side view 270 of the combined structures of arrays 240 and 250 of FIGS. 2D and 2E respectively according to an embodiment the present invention. The compute block 220 portions of DPUs 200 and the routing 242 are shown as fabricated in the substrate of integrated circuit 272, while the memory block portions of DPUs 200 are shown as fabricated in the substrate of integrated circuit 274. The small unlabeled vertical arrows are placeholders for the inter-block portions of the conductors 206, 210 and 218 shown in FIG. 2B and represent the connection points between the compute blocks 220 and the memory blocks 222 when the structure is fully assembled. In this embodiment, the assembly is to be implemented using die stacking with a through-silicon via (TSV) technology. While multiple TSVs are used in any embodiment employing them, only one exemplary TSV 276 is labeled in FIG. 2G. Persons skilled in the art will realize many other inter-die bonding and TSV fabrication techniques may be used and fall within the scope of the invention.

Figure 3A:
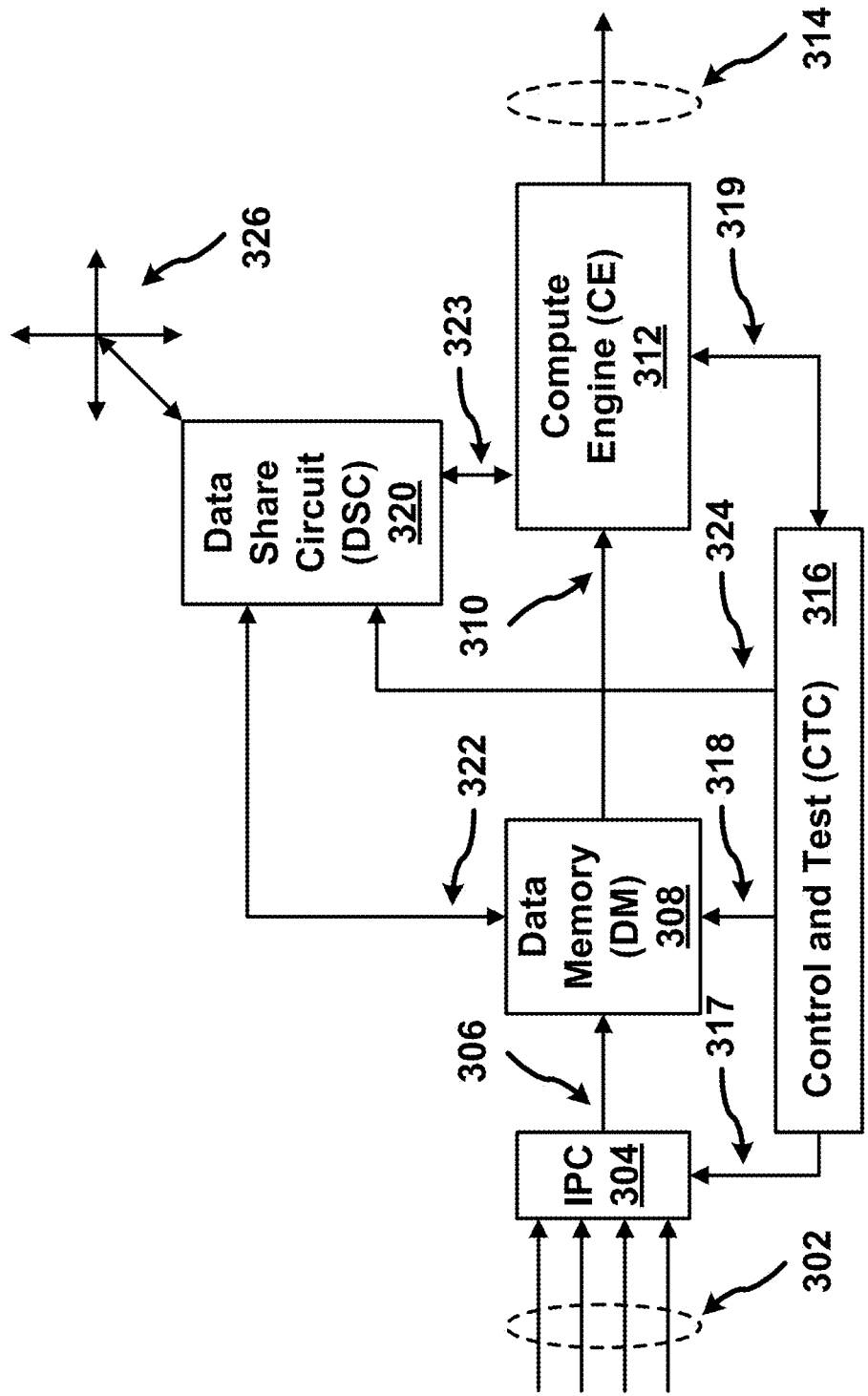
FIG. 3A illustrates an exemplary DPU according to an embodiment of the present invention.

FIG. 3A illustrates an exemplary DPU 300 according to an embodiment of the present invention. DPU 300 comprises a plurality of data input conductors 302 coupled to an input processing circuit (IPC) 304, a data memory (DM) 308 coupled to the IPC 304 through data conductors 306, a compute engine (CE) 312 coupled to the DM 308 through data conductors 310, data output conductors 314 coupled to CE 312, a control and test circuit (CTC) 316 coupled to IPC 304, DM 308 and CE 312 through control conductors 317, 318 and 319 respectively, a data share circuit (DSC) 320 coupled to DM 308 by data conductors 322 and CE 312 by data conductors 323, to CTC 316 through control conductors 324, and to data share conductors 326. In the sense used here, "conductors" means a "bus of one or more electrically conductive signal lines."

The operation of DPU 300 is similar to, though more generalized than, that of DPU 100 from FIG. 1. For example, in some embodiments input processing circuit 304 may perform a multiplexing function similar to that of multiplexer 104, but may contain other circuitry used for processing input data as well as providing some of the test functionality for DPU 300 including the inter-DPU connectivity of input data lines 302.

Similarly, data memory 308 may be used for value and coefficient data in some embodiments, but may also be used to store other sorts of data depending on the functionality of compute engine 312.

Compute engine 312 may perform multiply and accumulate functionality, but may also comprise hardware or software enabling other types of computations. CE 312 may also be configured or reconfigured at power up, system reset, or on-the-fly to perform different computations at different times as a matter of design choice.

Control and test circuit 316 may orchestrate the interactions between IPC 304, DM 308, CE 312 and DSC 320. CTC 316 may operate the DPU 300 in its normal computational mode during normal array processing times, control its test functions at appropriate times, configure or reconfigure any portion of DPU 300 as needed, may change the routing interconnect configuration of DSC 320 to replace a defective DPU 300, a defective DM or a defective CE, and may orchestrate the flow of data into and out of DPU 300.

DSC 320 may provide switching functionality from DPU 300 to other DPUs 300 in the same compute array. In some embodiments, DSC 320 combined with share data conductors 326 may allow the compute engine 312 in one DPU 300 to access the data memory 308 in another DPU 300. Similarly, in some embodiments data like, for example, overflow data may be shared between compute engines 312 in different DPUs 300 via share data conductors 326. In other embodiments, an entire CE 312 or DM 308 can be completely replaced as part of an array repair.

It will be appreciated by those skilled in the art that the output conductors 314 of DPU 300 may couple to the input data conductors 302 of multiple DPUs 300 to allow different compute array configurations as well as compute array redundancy and repairs. Similarly, it will be appreciated by such skilled persons that a sufficient number of input data conductors 302 may be coupled to other DPUs 300 to allow different compute array configurations as well as compute array redundancy and repairs. It will be further appreciated by such skilled persons that share data conductors 326 may be unidirectional or bidirectional, and that a sufficient number of share data conductors 326 may be coupled to the data share conductors 326 of other DPUs 300 to allow different compute array configurations, passing overflow data to a DPU running a parallel computation, and to allow compute array redundancy and repairs. Such skilled persons will also appreciate that more than one output data conductor 314 may be present in some embodiments to simplify different computer array configurations, redundancy, and repairs.

Figure 3B:
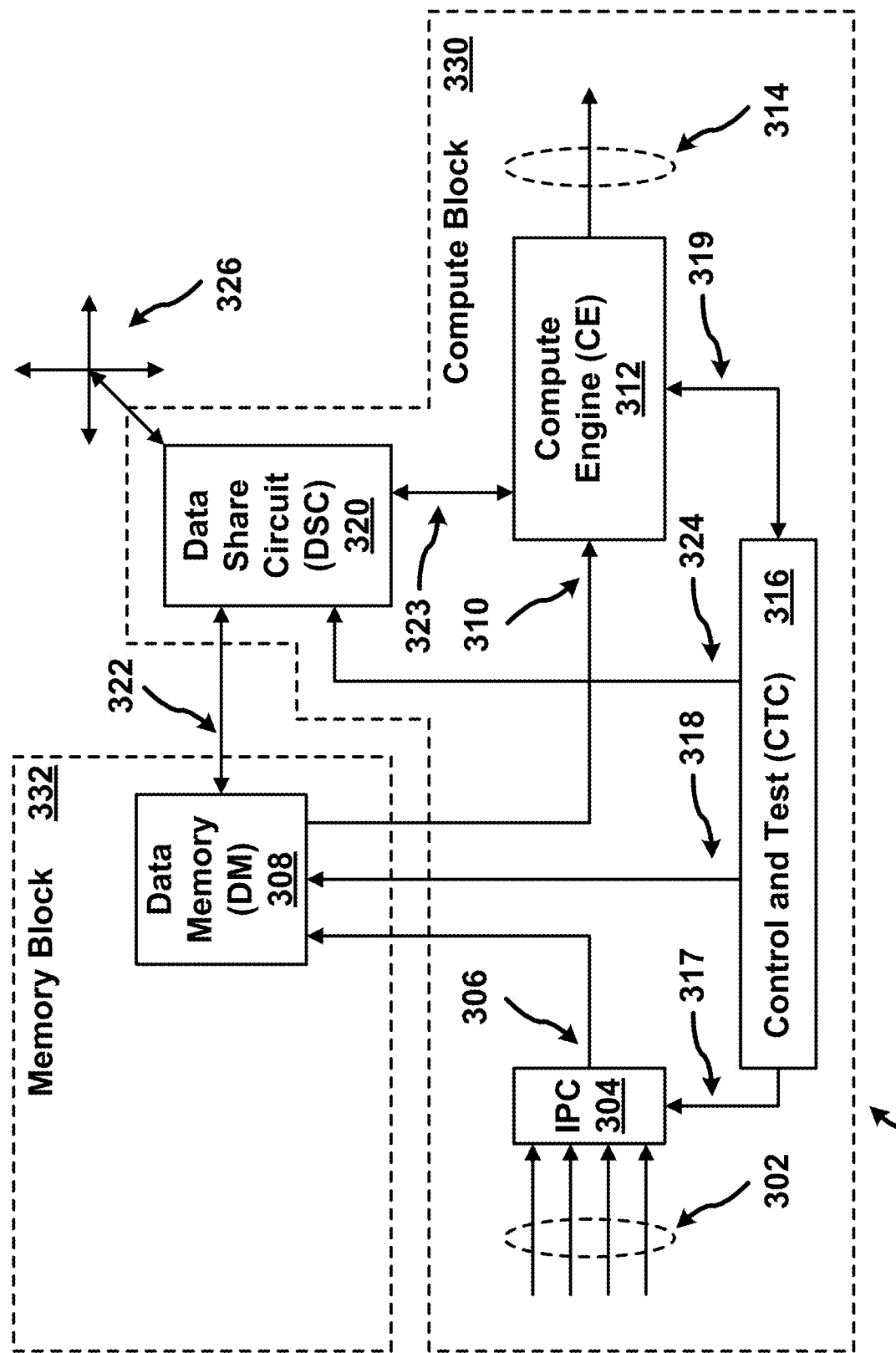
FIG. 3B illustrates the exemplary DPU of FIG. 3A partitioned into a compute block and a memory block according to an embodiment the present invention.

FIG. 3B illustrates the exemplary DPU 300 of FIG. 3A, showing it partitioned into a compute block 330 and a memory block 332 according to an embodiment of the present invention. The functionality of DPU 300 may be substantially the same as in FIG. 3A. The partitioning may allow part of the circuitry of DPU to be fabricated on two different semiconductor wafers and then assembled together as a single circuit. Not only does this save die area and packaging costs, it also allows compute block 330 and memory block 332 to be fabricated using different technology nodes and/or different processes better suited to the compute and memory functions. In some embodiments CTC 316 may be used configure DPU 300 to isolate a defective memory block 332 and allow compute block 330 to access data from the memory block 332 in another DPU 300 through data conductors 323, DSC 320 and data share conductors 326. Similarly, in some embodiments CTC 316 may be used configure DPU 300 to isolate a defective compute block 330 and allow memory block 332 to be accessed from the compute block 330 in another DPU 300 through data conductors 322, DSC 320 and data share conductors 326.

Figure 3C:
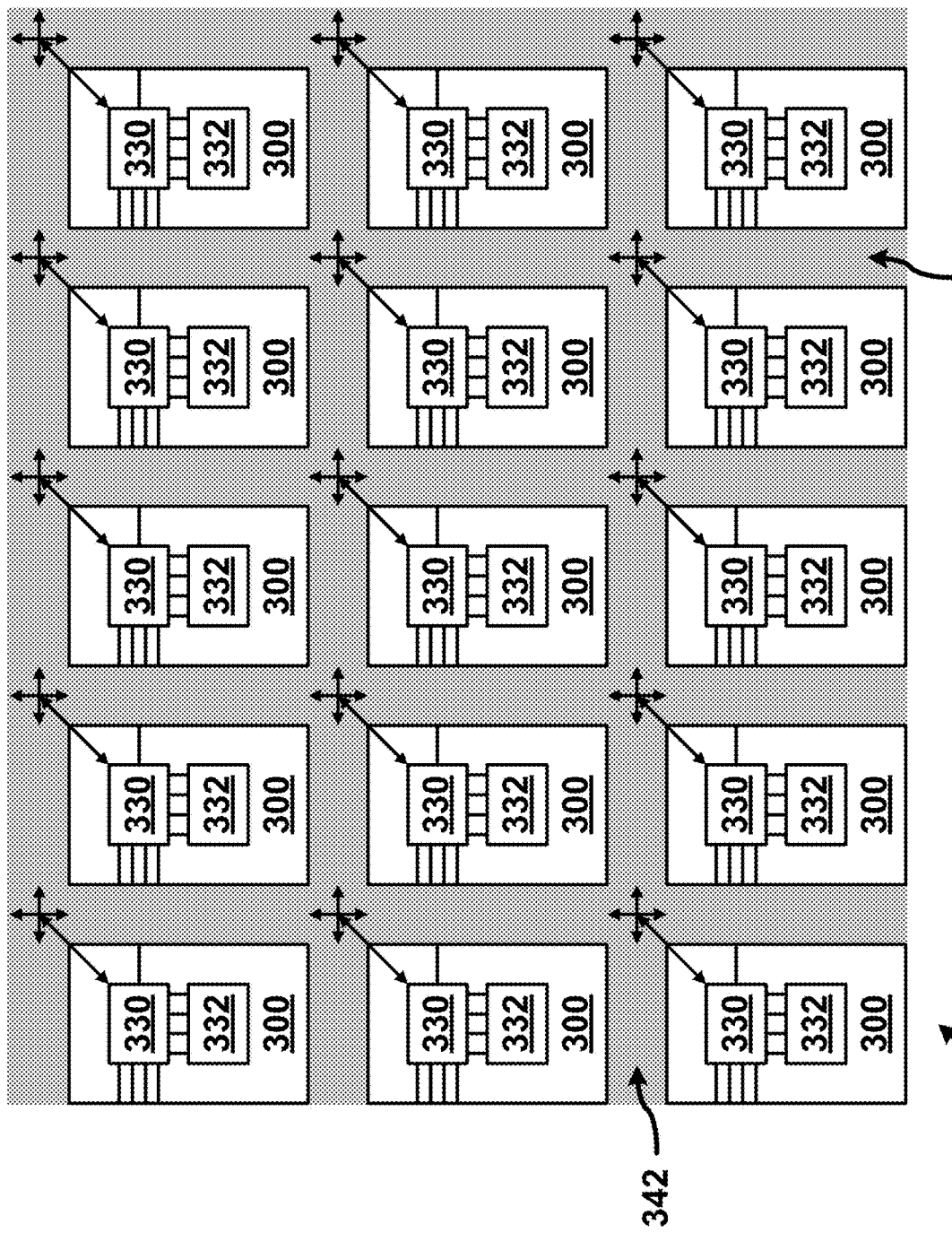
FIG. 3C illustrates an array of the exemplary DPUs of FIG. 3A according to an embodiment the present invention.

FIG. 3C illustrates an array 340 of the exemplary DPUs 300 of FIG. 3A according to an embodiment of the present invention. The array 340 comprises rows and columns of DPUs 300. Further shown are the compute blocks 330 and memory blocks 332. In this embodiment, each instance of DPU 300 and its compute block 330 and memory block 332 is implemented in the same integrated circuit.

The routing 342 between the DPUs 300 is shown abstractly as a shaded area. While routing 342 is shown between the DPUs 300 in the diagram, persons skilled in the art will appreciate that interconnections may run through the DPUs 300 and not just around them. Routing 342 is used for the interconnection of the data input conductors 302, the data output conductors 312, and the data share conductors 326, as well as for the distribution of global control signal conductors, clock signal conductors, power and ground supply conductors, etc. Persons of ordinary skill in the art will appreciate that there are many ways these different conductors may be organized and interconnected as a function of the intended applications for the array 340 and are a matter of design choice for each embodiment of the invention.

Figure 3D:
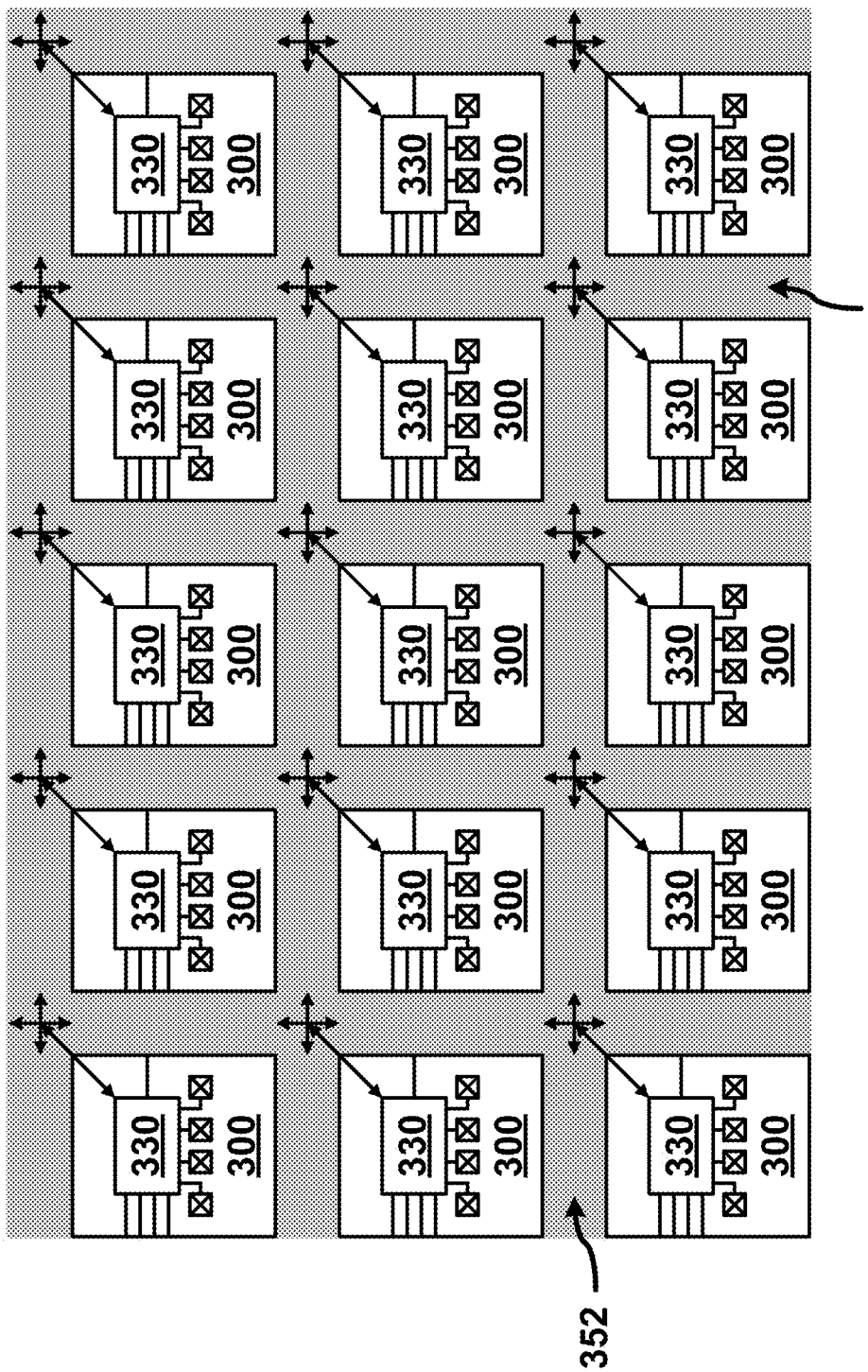
FIG. 3D illustrates an array of the exemplary DPUs of FIG. 3A with the memory block removed according to an embodiment the present invention.

FIG. 3D illustrates an array 350 of the exemplary DPUs 300 of FIG. 3A with the memory block removed according to an embodiment the present invention. FIG. 3D illustrates the rows and columns of DPUs 300 in the array 350. Also shown are the compute blocks 330 and an abstraction of the routing 342. These may be similar to the compute blocks 330 and routing 342 in FIG. 3C. In each DPU 300 there are shown abstractions of four small interconnect pads (unlabeled squares with an internal "X" shape). These are placeholders for the inter-block portions of the conductors 306, 310, 318 and 324 shown in FIG. 3B and represent the connection points to the memory blocks 332 that will eventually be assembled on top of the compute blocks 330.

Figure 3E:
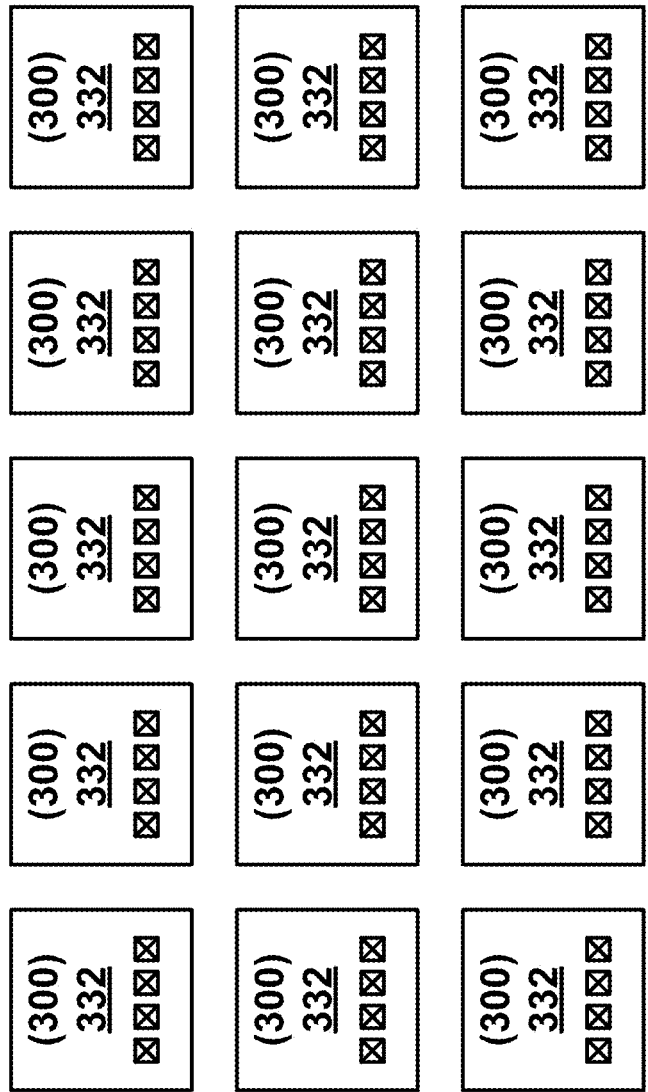
FIG. 3E illustrates an exemplary array of the memory blocks located over the locations of the DPUs in the array of FIG. 3D according to an embodiment the present invention.

FIG. 3E illustrates an exemplary array 360 of the memory blocks 332 located over the locations of the DPUs 300 in array 340 of FIG. 3D (not shown) according to an embodiment the present invention. In each memory block 332 there are shown abstractions of four small interconnect pads (unlabeled squares with an internal "X" shape). These are placeholders for the conductors 306, 310, 318 and 324 shown in FIG. 3B and represent connection points to the compute blocks 330 that will eventually be assembled underneath the memory blocks 332. In this embodiment there is no interconnection directly between the memory blocks 332. This isolation allows the same wafer to be scribed into integrated circuits comprising different sizes of array 360 to be paired up with different sizes of array 350 for different applications. Thus one mask set can provide all of the memory blocks 322 for an entire family of parts comprising devices where array 350 may be differently sized and compute block 220 may be differently designed or configured for different applications, saving considerable mask making costs.

Figure 3F:
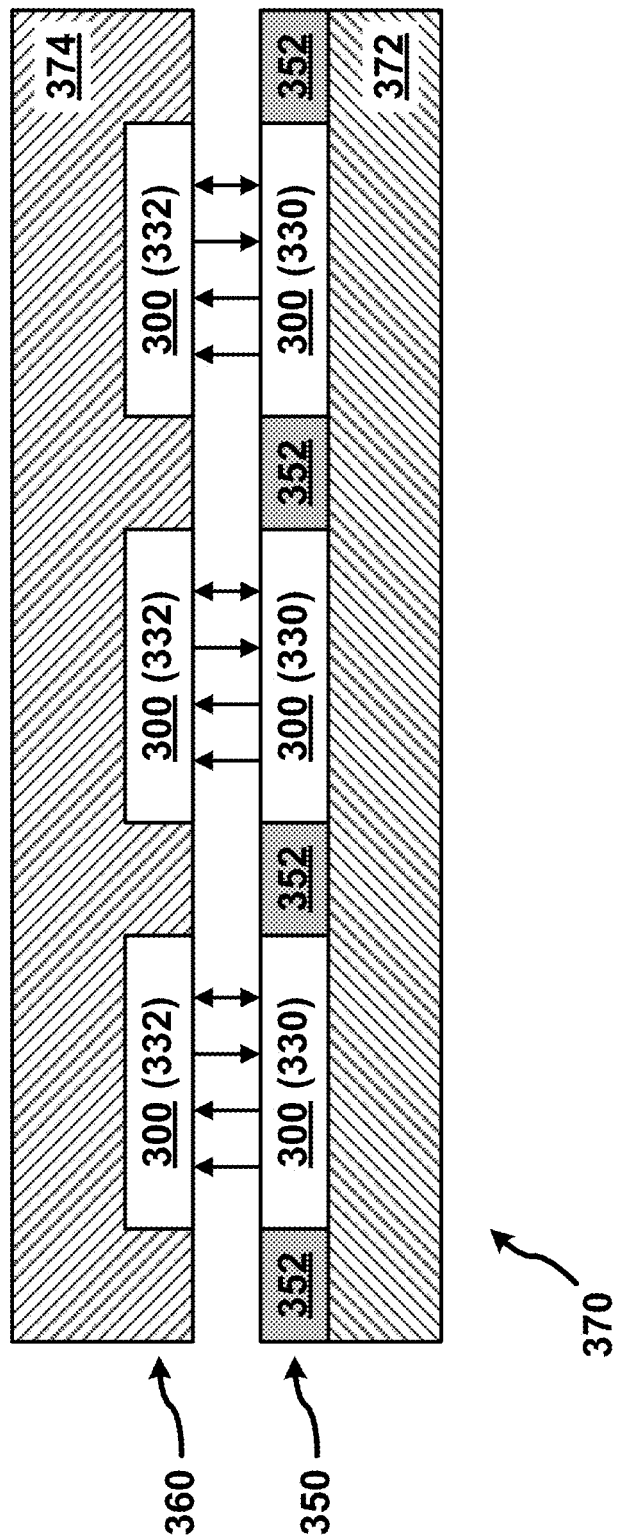
FIG. 3F illustrates a side view of the combined structures of FIGS. 3D and 3E respectively, according to an embodiment the present invention.

FIG. 3F illustrates a side view 370 of the combined structures of arrays 350 and 360 of FIGS. 3D and 3E respectively according to an embodiment the present invention. The compute block 330 portions of DPUs 300 and the routing 352 are shown as fabricated in the substrate of integrated circuit 372, while the memory block 332 portions of DPUs 300 are shown as fabricated in the substrate of integrated circuit 374. The small unlabeled vertical arrows are placeholders for the inter-block portions of the conductors 306, 310, 318 and 324 shown in FIG. 3B and represent the connection points between the compute blocks 330 and the memory blocks 332 when the structure is fully assembled. In this embodiment, the assembly may be implemented using any face-to-face (F2F) or wafer-to-wafer (W2W) bonding connection as a matter of design choice.

Figure 3G:
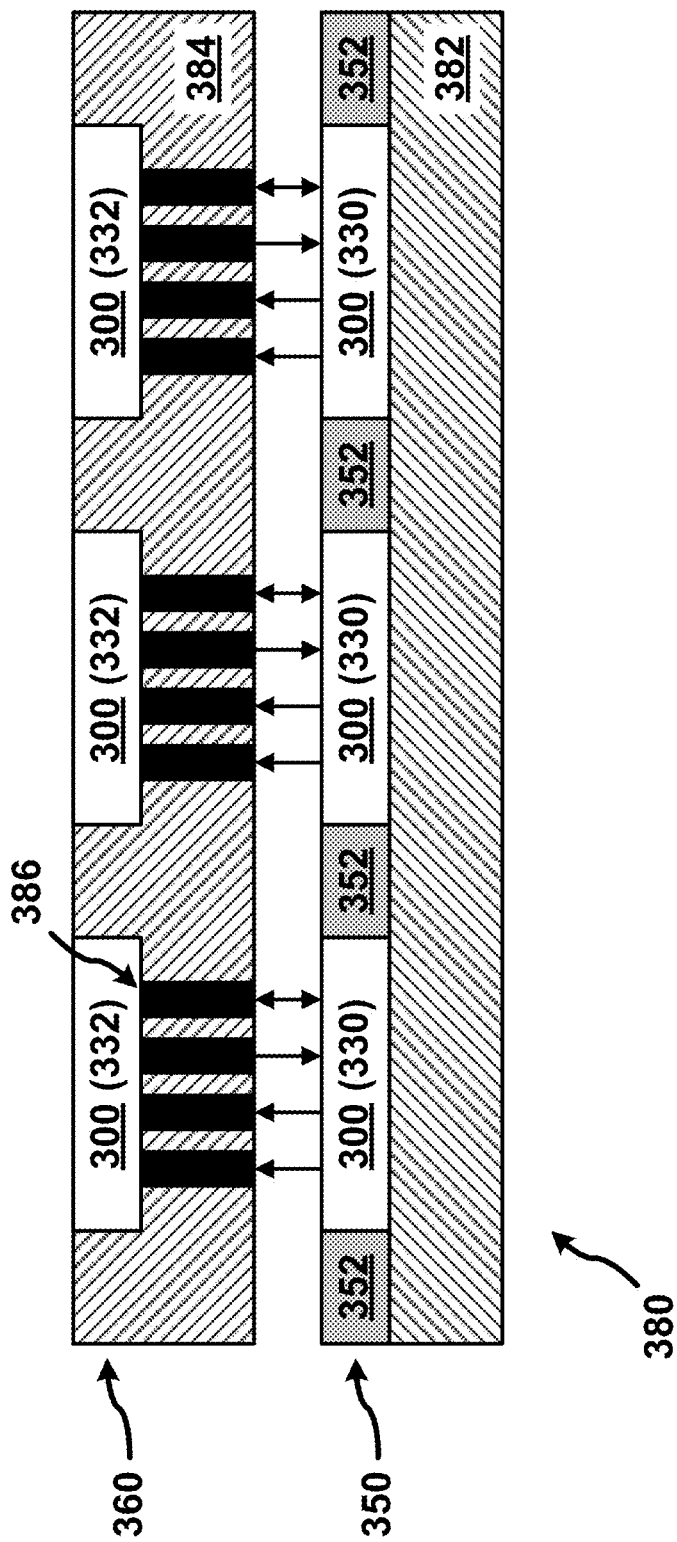
FIG. 3G illustrates a side view of the combined structures of the arrays of FIGS. 3D and 3E respectively, according to another embodiment the present invention.

FIG. 3G illustrates a side view 380 of the combined structures of arrays 350 and 360 of FIGS. 3D and 3E respectively according to an embodiment the present invention. The compute block 330 portions of DPUs 300 and the routing 352 are shown as fabricated in the substrate of integrated circuit 382, while the memory block portions of DPUs 300 are shown as fabricated in the substrate of integrated circuit 384. The small unlabeled vertical arrows are placeholders for the inter-block portions of the conductors 306, 310, 318 and 324 shown in FIG. 3B and represent the connection points between the compute blocks 330 and the memory blocks 332 when the structure is fully assembled. In this embodiment, the assembly is to be implemented using die stacking with through-silicon via (TSV) technology. While multiple TSVs are used in any embodiment employing them, only one exemplary TSV 386 is labeled in FIG. 3G.

Returning to FIG. 3B, data share circuit 320 is advantageous because it allows data to be shared between multiple DPUs 300 in arrays like the ones illustrated in FIGS. 3C through 3G utilizing data share conductors 326. One advantage it provides is a way to pass overflow results to adjacent DPUs to insure the integrity of computations. Another advantage it provides is allowing the array to be self-healing since DPU 300 can utilize the data memory 308 in another DPU 300 for storage. A third advantage is that it allows for computations requiring sharing computational input and other data between DPUs 300 like, for example, performing floating point operations using single, double, quadruple, etc., precision as is done in some SIMD (single instruction, multiple data) compute architectures in GPUs, DSPs and other array processors. A fourth advantage is that the three dimensional (3D) structure improves performance because the distance between DPUs 300 is reduced so inter-DPU drivers can be smaller. A fifth advantage is that the 3D structure also reduces the capacitance in the inter-die connections, particularly in embodiments employing F2F and W2 W bonding technology. A sixth advantage is the lower capacitance reduces the overall power in the DPU arrays. A seventh advantage is the reduced distances facilitate the replacement of defective compute blocks 330 and defective memory blocks 332. Persons of ordinary skill in the art will realize that there are many different ways that DSCs 320 in different DPUs 300 can be coupled to each other utilizing data share conductors 326.

Figure 4A:
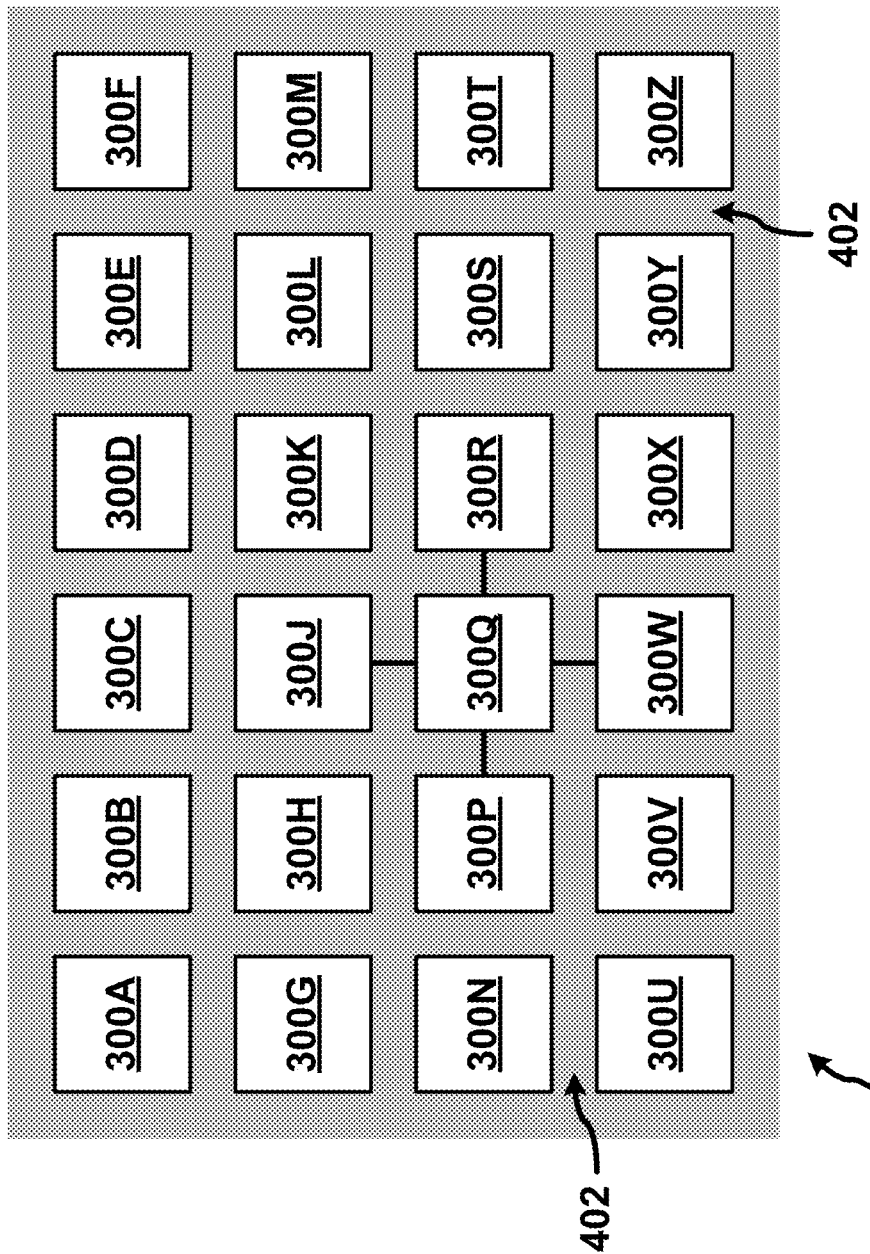
FIG. 4A illustrates an array of exemplary DPUs according to an embodiment the present invention.

FIG. 4A illustrates an array 400 of the exemplary DPUs 300 of FIG. 3A according to an embodiment the present invention. The routing of the various interconnections between the DPUs 300 are shown abstractly at reference numeral 402. The DPUs are labeled 300A through 300H, 300J through 300N, and 300P through 300Z to facilitate discussion of the data share conductors 326. In this embodiment, DPU 300Q is shown coupled to its four nearest neighbors, DPUs 300J, 300P, 300R and 300W through different groups comprising one or more data share conductors 326 (not labeled). Each of the data share conductors 326 may be configured to transfer data in a unidirectional fashion or a bidirectional fashion as a matter of design choice in any given embodiment.

Figure 4B:
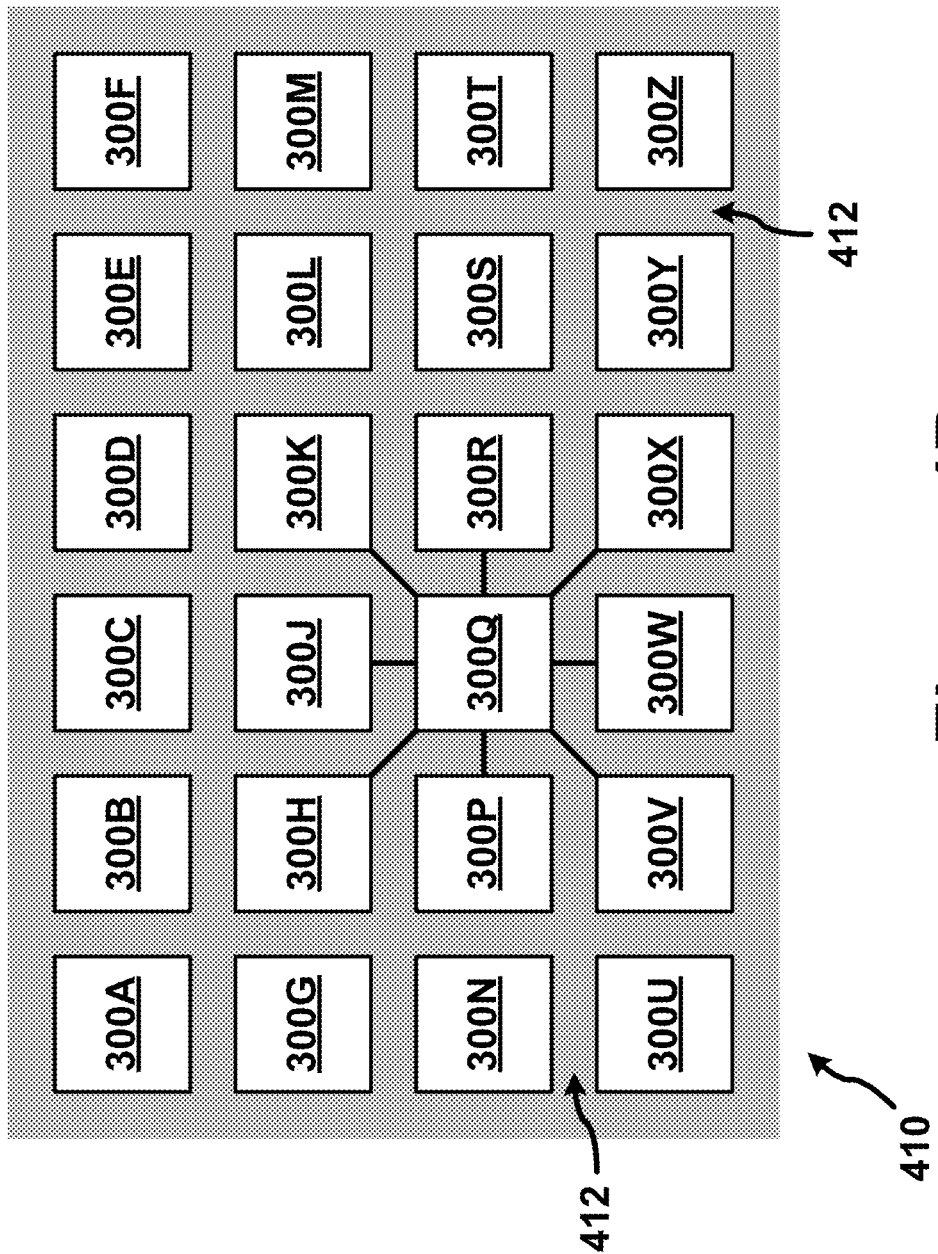
FIG. 4B illustrates an array of exemplary DPUs according to an embodiment the present invention.

FIG. 4B illustrates an array 410 of the exemplary DPUs 300 of FIG. 3A according to an embodiment the present invention. The routing of the various interconnections between the DPUs 300 are shown abstractly at reference numeral 412. The DPUs are labeled 300A through 300H, 300J through 300N, and 300P through 300Z to facilitate discussion of the data share conductors 326. In this embodiment, DPU 300Q is shown coupled to its eight nearest neighbors, DPUs 300H, 300J, 300K 300P, 300R, 300V, 300W and 300X through different groups comprising one or more data share conductors 326 (not labeled). Each of the data share conductors 326 may be configured to transfer data in a unidirectional fashion or a bidirectional fashion as a matter of design choice in any given embodiment.

Figure 4C:
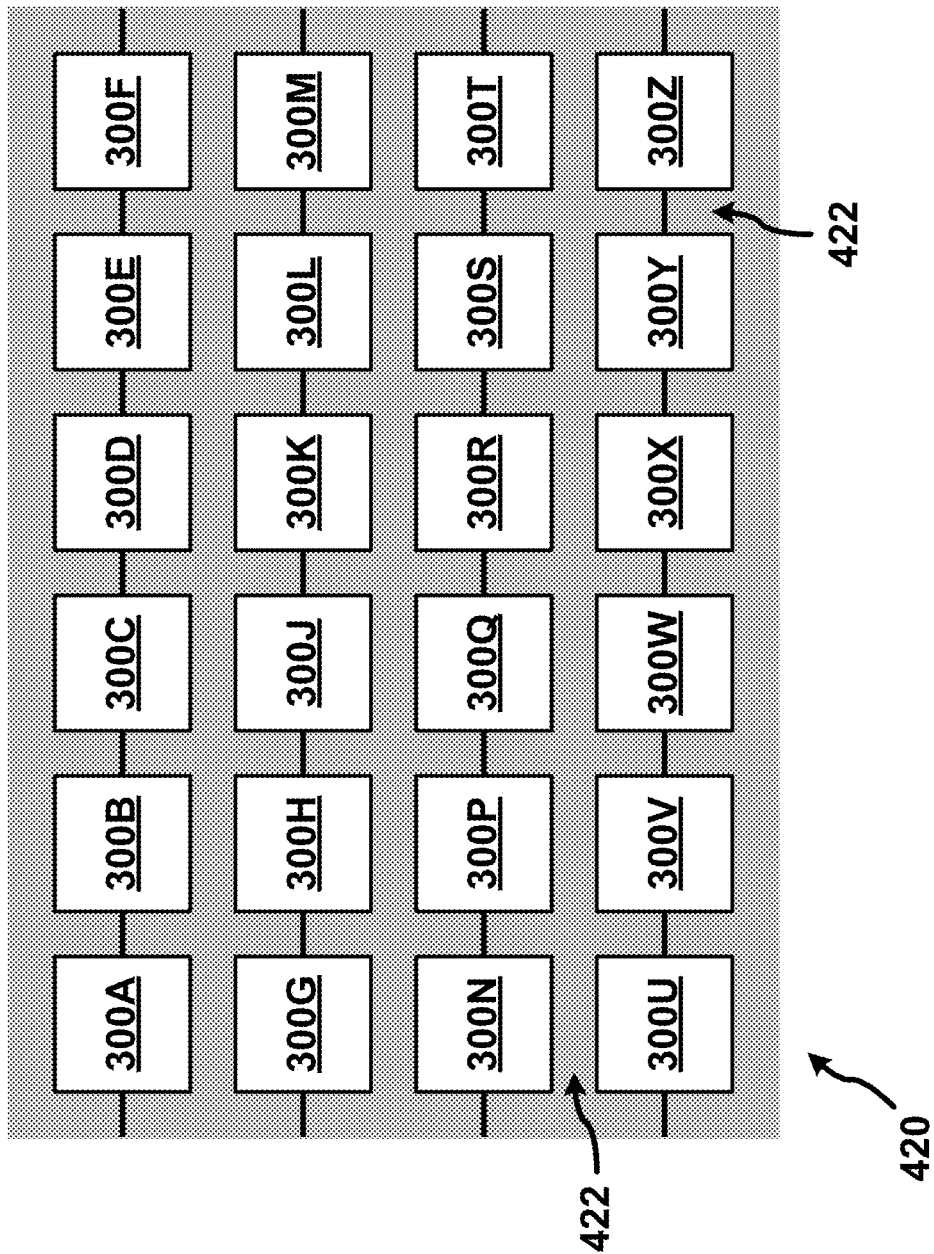
FIG. 4C illustrates an array of exemplary DPUs according to an embodiment the present invention.

FIG. 4C illustrates an array 420 of the exemplary DPUs 300 of FIG. 3A according to an embodiment the present invention. The routing of the various interconnections between the DPUs 300 are shown abstractly at reference numeral 422. The DPUs are labeled 300A through 300H, 300J through 300N, and 300P through 300Z to facilitate discussion of the data share conductors 326. In this embodiment, the DPUs 300 on each row are shown coupled to its two nearest neighbors in the horizontal directions through data share conductors 326 (not labeled). For example, DPU 300Q is coupled to DPU 300P and DPU 300R, and DPU 300L is coupled to DPU 300K and DPU 300M through different groups comprising one or more data share conductors 326. This embodiment illustrates that the data share conductors 326 do not need to be present in all directions. Each of the data share conductors 326 may be configured to transfer data in a unidirectional fashion or a bidirectional fashion as a matter of design choice in any given embodiment. Persons skilled in the art will realize that there are also input conductors 302 and output conductors 314 present in the abstract interconnect 422 and that vertical communications are possible through those conductors in this embodiment.

Figure 4D:
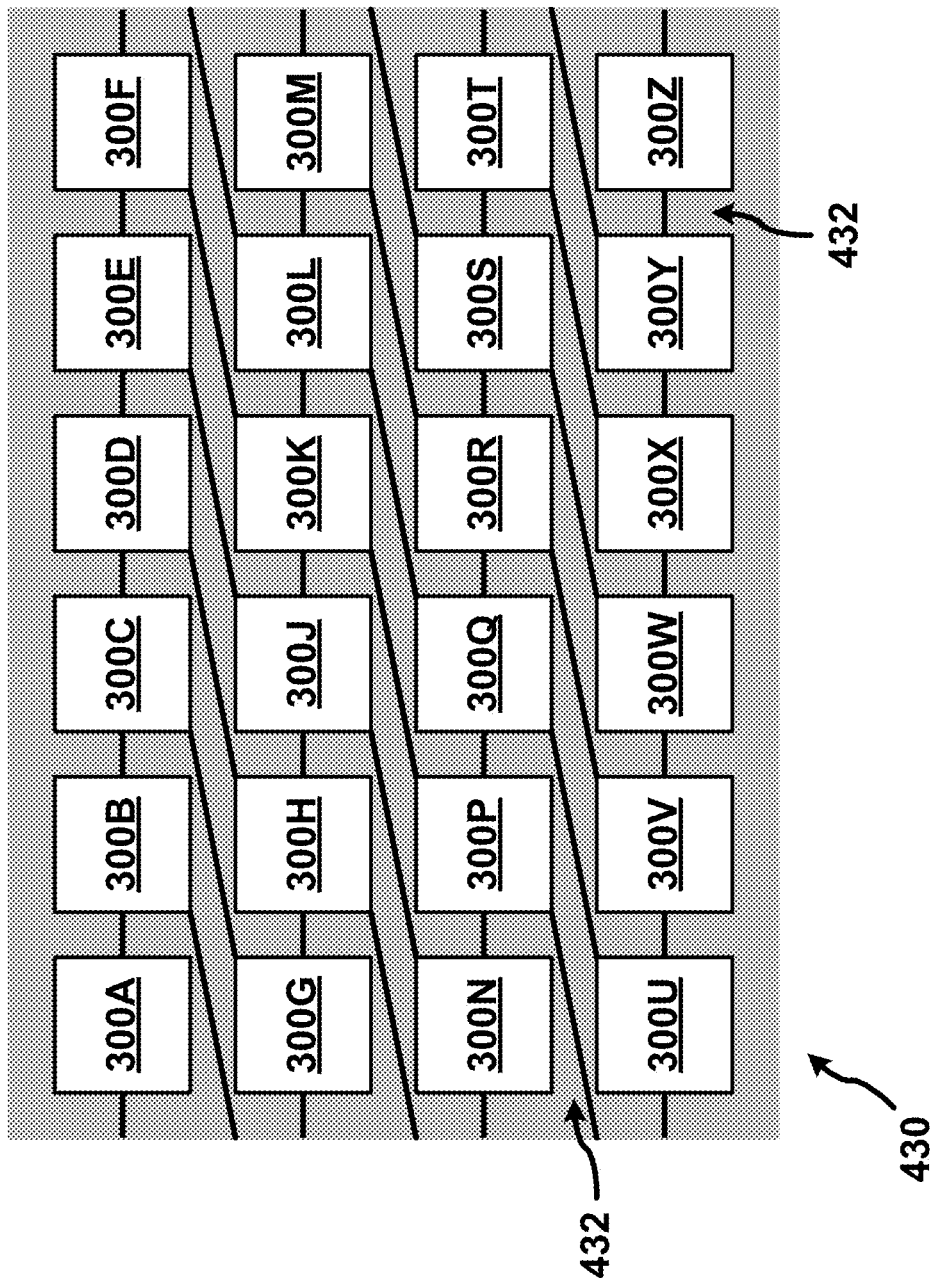
FIG. 4D illustrates an array of exemplary DPUs according to an embodiment the present invention.

FIG. 4D illustrates an array 430 of exemplary DPUs 300 according to an embodiment the present invention. The routing of the various interconnections between the DPUs 300 are shown abstractly at reference numeral 432. The DPUs are labeled 300A through 300H, 300J through 300N, and 300P through 300Z to facilitate discussion of the data share conductors 326. In this embodiment, the DPUs 300 on each row are shown coupled to its two nearest neighbors in the horizontal directions through groups of data share conductors 326 (not labeled). For example, DPU 300Q is coupled to DPU 300P and DPU 300R, and DPU 300L is coupled to DPU 300K and DPU 300M. In addition, another group of data share conductors 326 is shown connecting each DPU 300 to the DPU 300 horizontally two columns to the right and vertically one row up. For example, DPU 300Q is coupled to DPU 300U and DPU 300L, and DPU 300K is coupled to DPU 300P and DPU 300F through different groups comprising one or more data share conductors 326. This embodiment illustrates that the data share conductors 326 do not need to be symmetrically disposed in array 430 either horizontally or vertically. Similarly, there is no need for diagonal, circular or any other form of symmetry. Each of the data share conductors 326 may be configured to transfer data in a unidirectional fashion or a bidirectional fashion as a matter of design choice in any given embodiment.

Persons skilled in the art will realize that describing the relative positions of DPUs 300 and their associated conductors 302, 314 and 326 in terms such as horizontal and vertical, up and down, left or right, etc., are abstractions and describe conditions locally in a particular figure. For example, horizontal and vertical can be exchanged by simply rotating the array by 90°. Similarly, mirroring the array can exchange left for right and/or up for down. Such skilled persons will further appreciate that in the embodiments where memory blocks 332 were placed above compute blocks 330, this too was an abstraction and above and below can be exchanged by a simple mirroring or rotating of the assembly.

Referring back to FIG. 3E, in some embodiments there may be no interconnections between the memory blocks 332. This means that the memory blocks may be completely independent prior to assembly. They can be tested in a conventional manner by probing, or after they are assembled together with the die containing the compute blocks 330 illustrated in FIG. 3D to form complete instances of DPU 300. This may also be true with respect to the memory blocks 222 in FIG. 2E when assembled together with compute blocks 220 to form complete instances of DPU 200.

Referring back to FIG. 3B, the control and test circuit (CTC) 316 is shown coupled to IPC 304, DM 308, CE 312 and DSC 320. In a test mode, CTC 316 may be capable of executing a local built-in self-test (BIST) of all the circuitry in compute block 330. When memory block 332 is coupled to compute block 330, CTC 316 is capable of executing a local BIST of the entire DPU 300. In some embodiments, this is the only way memory block 332 may be tested.

It may be desirable to avoid the test costs of probing and testing the integrated circuit the memory blocks 332 when fabricated in like, for example, integrated circuits 374 and 384 in FIGS. 3F and 3G respectively. In embodiments where this approach is taken various advantages may accrue.

In some embodiments, an entire wafer comprising nothing but memory blocks 332 (and possibly some test structures in a few locations) may be fabricated. Such a wafer may be used to provide the memory arrays 360 for integrated circuits having different sized arrays of compute blocks 330. In such an embodiment, the memory block 332 wafer may be scribed into rectangles of differing numbers of rows and columns to be fit to a particular array of compute blocks 330 by use of face-to-face or through-silicon via bonding techniques.

In some embodiments, an entire wafer comprising nothing but memory blocks 332 (and possibly some test structures in a few locations) may be fabricated, and when correctly aligned this wafer may be bonded to a wafer comprising integrated circuits with compute arrays comprising compute blocks 330 (and other circuits) using a wafer-to-wafer bonding technology. The memory blocks 332 that align with compute blocks 330 will form DPUs 300, while the remainder of the memory blocks 332 may be wasted. It may be necessary to etch back the unused portion of the memory block 332 wafer or use TSVs or some other mechanism to connect the compute block 330 wafer.

While F2F or W2 W technology offer significant cost reductions, they also create challenges. In particular, using CTC 316 to test the memory block 332 only after the entire DPU 300 has been assembled may need a method of correcting for defects detected after assembly.

In embodiments utilizing DPU 200 from FIG. 2A, a defect in either the compute block 220 or the memory block 222 requires the entire DPU 200 to be labeled defective and not be used. There are many ways to accomplish this. For example, in some embodiments spare and normally unused rows and/or columns of DPUs 200 may be inserted. When a defective DPU 200 is located, either the row or column may be deactivated and signals multiplexed through the defective row or column to allow the array to function normally.

In other embodiments, the algorithm used in the array of DPUs 200 may be sufficiently tolerant to allow the non-operation of a few individual DPUs 200 without destroying the overall accuracy of the computation. There are a variety of ways this could be accomplished. For example, the output of the compute engine 212 could be set to a nominal or average output value. In this way, data output conductors 214 would present the nominal or average value to other DPUs 200 in the array and the overall results of the array might be sufficiently accurate.

In embodiments utilizing DPU 300 from FIG. 3A, a defect in either the compute block 330 or the memory block 332 may not require the entire DPU 300 to be labeled defective and not be used. The data share circuit 320 combined with the data share conductors 326 may allow a compute block 330 with a defective memory block 332 to use some or all of the data memory 308 in a nearby DPU 300. This has the potential for the array to do a better job of self-healing and allow testing after F2F or W2 W bonding with higher yields. In a similar fashion, a defective compute block 330 could share its memory block 332 with adjacent fully functional compute blocks 330. The degree and interconnect pattern of such sharing and self-healing functionality is a matter of design choice for a particular compute array design.

Another way to repair a defective DPU 300 may be to include some programmable logic and/or programmable routing inside the compute block 330. In some embodiments, the functional portion of compute block 330 may be implemented at least in part with programmable logic and/or programmable routing. Such a DPU 300 could be reprogrammed at intervals to produce multiple different compute functions during different portions of normal operation.

In some embodiments, the partitioning of the DPU 300 may be done for other reasons than separating the compute function from the memory function. For example, a DPU 330 may be partitioned such that part of the compute function and part of the memory function are partially in each partition. This may have advantages in a F2F or W2 W structure by having the two compute function portions directly above and below one another to reduce wire lengths and increase computational speed. Similar advantages may accrue to each of the fractional memory functions being smaller and thus individually faster than a single larger memory function.

In some embodiments, the compute engines 312 in different DPUs 300 may have different compute functions. These can be hardwired into the compute engines 312, or programmed into the compute engines 312 by the control and test circuits 316 at start up, during a system reset, for different modes of operation, or upon request. This may also be done in embodiments employing DPU 200, compute engine 212 and control and test circuit 216.

Those of ordinary skill in the art will realize that the above figures and descriptions are exemplary only. Many other embodiments will readily suggest themselves to such skilled persons after reviewing this disclosure. Thus the invention is not to be limited in any way except by the issued claims.

What is claimed is:

1. A compute array comprising rows and columns of data processing units, each data processing unit comprising:
   a plurality of data input conductors, each data input conductor comprising a bus of one or more electrically conductive signal lines;
   an input processing circuit coupled to the plurality of data input conductors;
   a data memory coupled to the input processing circuit;
   a compute engine coupled to the data memory;
   a data output conductor coupled to the compute engine, the data output conductor comprising a bus of one or more electrically conductive signal lines; and
   a control and test circuit coupled to the input processing circuit, the data memory, and the compute engine, wherein each data input conductor is coupled to the data output conductor of another data processing unit and each data output conductor is coupled to a data input conductor of another data processing unit.

2. The compute array of claim 1, wherein:
   each data processing unit is partitioned into a memory block comprising substantially the data memory and a compute block comprising substantially the remainder of the data processing unit,
   each memory block and its associated compute block in the same data processing unit are fabricated in two different integrated circuits, and
   each memory block and the compute block in the same data processing unit are coupled together by an interconnect technology of at least one from the group consisting of: face-to-face bonding, wafer-to-wafer bonding, through-silicon via connections, dielectric bonding technology, oxide-to-oxide direct bonding, and hybrid bonding.

3. The compute array of claim 2, wherein each control and test circuit is configured to:
   test its data processing unit for functionality, and
   test the data input conductor connections and the data output conductor interconnections between the other data processing units coupled to its data processing unit.

4. The compute array of claim 3, wherein each control and test circuit is configured to program the compute functionality of the compute engine in its data processing unit.

5. The compute array of claim 1, each data processing unit further comprising:
   a plurality of data share conductors coupled to the data share conductors of a plurality of other data processing units, each data share conductor comprising a bus of one or more electrically conductive signal lines; and a data share circuit coupled to the data share conductors, the data memory, the compute engine, and the control and test circuit and configured to:

selectively couple the data memory to the plurality of data share conductors, and selectively couple the compute engine to the data share conductors.

6. The compute array of claim 5, wherein:

each data processing unit is partitioned into a memory block comprising substantially the data memory and a compute block comprising substantially the remainder of the data processing unit, each memory block and its associated compute block in the same data processing unit are fabricated in two different integrated circuits, and each memory block and its associated compute block in the same data processing unit are coupled together by an interconnect technology of at least one from the group consisting of: face-to-face bonding, wafer-to-wafer bonding, through-silicon via connections, dielectric bonding technology, oxide-to-oxide direct bonding, and hybrid bonding.

7. The compute array of claim 6, wherein each control and test circuit is configured to:

test its associated data processing unit for functionality, test the data input conductor connections and the data output conductor interconnections between the other data processing units so coupled to its data processing unit, and test the data share interconnections between the other data processing units so coupled to its data processing unit.

8. The compute array of claim 7, wherein each control and test circuit is configured to program the compute functionality of the compute engine in its data processing unit.

9. The compute array of claim 6, wherein each data share circuit can be configured to allow the compute engine in the same data processing unit to access the data memory of a different data processing unit.

10. The compute array of claim 9, wherein allowing the compute engine in the same data processing unit as the data share circuit to access the data memory of a different data processing unit can completely replace the data memory of the same data processing unit.

11. The compute array of claim 6, wherein each data share circuit can be configured to allow the data memory in the same data processing unit to be accessible to the compute engine of a different data processing unit.

12. The compute array of claim 11, wherein allowing the data memory in the same data processing unit as the data share circuit to be accessible to the compute engine of a different data processing unit can completely replace the compute engine of the same data processing unit.

13. The compute array of claim 5, wherein each data share circuit can be configured to allow the compute engine in the same data processing unit to access the data memory of a different data processing unit.

14. The compute array of claim 13, wherein allowing the compute engine in the same data processing unit as the data share circuit to access the data memory of a different data processing unit can completely replace the data memory of the same data processing unit.

15. The compute array of claim 5, wherein each data share circuit can be configured to allow the data memory in the same data processing unit to be accessible to the compute engine of a different data processing unit.

16. The compute array of claim 15, wherein allowing the data memory in the same data processing unit as the data share circuit to be accessible to the compute engine of a different data processing unit can completely replace the compute engine of the same data processing unit.

17. A method for assembling compute arrays, each compute array comprising rows and columns of data processing units, each data processing unit being partitioned into a compute block and a memory block, the method comprising:

fabricating a first wafer of integrated circuits, wherein a substantial portion of the integrated circuits comprise arrays of the compute block portions of a plurality of data processing units;

fabricating a second wafer of integrated circuits, wherein:

a substantial portion of the integrated circuits comprise an array of the memory block portions of data processing units, and at least some of the arrays of memory block portions are sized and spaced such that they align with the compute block portions of the data processing units in the compute arrays on the first wafer when the wafers are correctly aligned; and bonding the first wafer and the second wafer together to form a plurality of compute arrays using an interconnect technology of at least one from the group consisting of: face-to-face bonding, wafer-to-wafer bonding, through-silicon via connections, dielectric bonding technology, oxide-to-oxide direct bonding, and hybrid bonding, wherein the aligned memory block portions and the compute block portions are electrically coupled to form complete data processing units at locations where both are present.

18. A method for assembling compute arrays, each compute array comprising rows and columns of data processing units, each data processing unit being partitioned into a compute block and a memory block, the method comprising:

fabricating a first wafer of integrated circuits, wherein a substantial portion of the integrated circuits comprise arrays of the compute block portions of a plurality of data processing units;

fabricating a second wafer of integrated circuits, wherein:

a substantial portion of the integrated circuits comprise an array of the memory block portions of data processing units, and at least some of the arrays of memory block portions are sized and spaced such that they align with the compute block portions of the data processing units in the compute arrays on the first wafer when the wafers are correctly aligned, the spacing between the memory portions of the second wafer are such that they can be used as scribe lines, the first wafer comprises a compute integrated circuit comprising an array of compute block portions with X rows and Y columns (X and Y being positive integers), and the second wafer configured to be scribed into integrated circuits including a memory integrated circuit comprising an array of memory block portions with X rows and Y columns;

scribing the second wafer into integrated circuits, including the compute integrated circuit comprising an array of memory block portions with X rows and Y columns; and bonding the memory integrated circuit and the compute integrated circuit together to form a compute array of data processing units with X rows and Y columns using an interconnect technology of at least one from the group consisting of: face-to-face bonding, wafer-to-wafer bonding, through-silicon via connections, dielectric bonding, oxide-to-oxide direct bonding, and hybrid bonding.

* * * * *

UNITED STATES PATENT AND TRADEMARK OFFICE
CERTIFICATE OF CORRECTION

PATENT NO. : 10,684,929 B2
APPLICATION NO. : 15/849468
DATED : June 16, 2020
INVENTOR(S) : Javier A. Delacruz et al.

It is certified that error appears in the above-identified patent and that said Letters Patent is hereby corrected as shown below:

In the Claims

Claim 18, Column 14, Line 36, please insert --portion-- after "compute block".

Claim 18, Column 14, Line 37, please insert --portion-- after "...memory block".

Claim 18, Column 14, Line 39, please delete "comprise" and replace it with --comprises--.

Claim 18, Column 14, Lines 43-44, please delete "comprise an array" and replace it with --comprises arrays--.

Claim 18, Column 14, Line 51, please delete "spacing" and replace it with --spacings--.

Claim 18, Column 14, Line 51, please insert --arrays of the-- after "...between the" and --block-- after "memory".

Claim 18, Column 14, Line 57, please insert --is-- after "wafer".

Claim 18, Column 14, Line 62, please delete "compute" and replace it with --memory-- and delete "an" and replace it with --the--.

Signed and Sealed this
Second Day of January, 2024

Katherine Kelly Vidal
*Director of the United States Patent and Trademark Office*